(12) United States Patent
Delacruz et al.

(10) Patent No.: US 11,929,347 B2
(45) Date of Patent: Mar. 12, 2024

(54) MIXED EXPOSURE FOR LARGE DIE

(71) Applicant: ADEIA SEMICONDUCTOR TECHNOLOGIES LLC, San Jose, CA (US)

(72) Inventors: Javier A. Delacruz, San Jose, CA (US); Belgacem Haba, Saratoga, CA (US)

(73) Assignee: ADEIA SEMICONDUCTOR TECHNOLOGIES LLC, San Jose, CA (US)

( * ) Notice: Subject to any disclaimer, the term of this patent is extended or adjusted under 35 U.S.C. 154(b) by 0 days.

(21) Appl. No.: 17/579,259

(22) Filed: Jan. 19, 2022

(65) Prior Publication Data

US 2022/0216180 A1 Jul. 7, 2022

Related U.S. Application Data

(63) Continuation of application No. 17/075,489, filed on Oct. 20, 2020, now Pat. No. 11,264,357.

(51) Int. Cl.
*H01L 23/00* (2006.01)
*H01L 21/68* (2006.01)
(Continued)

(52) U.S. Cl.
CPC ............ *H01L 24/97* (2013.01); *H01L 21/682* (2013.01); *H01L 23/5384* (2013.01);
(Continued)

(58) Field of Classification Search
CPC ... H01L 24/97; H01L 21/682; H01L 23/5384; H01L 23/5389; H01L 25/0655;
(Continued)

(56) References Cited

U.S. PATENT DOCUMENTS 4,612,083 A 9/1986 Yasumoto et al.
4,818,728 A 4/1989 Rai et al.
(Continued)

FOREIGN PATENT DOCUMENTS

CN 105140144 A 12/2015
CN 106653720 A 5/2017
(Continued)

OTHER PUBLICATIONS

U.S. Appl. No. 16/905,766, filed Jun. 18, 2020.
(Continued)

*Primary Examiner* — Elias Ullah
(74) *Attorney, Agent, or Firm* — Knobbe, Martens, Olson & Bear, LLP

(57) ABSTRACT

Techniques and arrangements for performing exposure operations on a wafer utilizing both a stepper apparatus and an aligner apparatus. The exposure operations are performed with respect to large composite base dies, e.g., interposers, defined within the wafer, where the interposers will become a part of microelectronic devices by coupling with active dies or microchips. The composite base dies may be coupled to the active dies via "native interconnects" utilizing direct bonding techniques. The stepper apparatus may be used to perform exposure operations on active regions of the composite base dies to provide a fine pitch for the native interconnects, while the aligner apparatus may be used to perform exposure operations on inactive regions of the composite base dies to provide a coarse pitch for interfaces with passive regions of the composite base dies.

28 Claims, 8 Drawing Sheets

(51) Int. Cl.
*H01L 23/538* (2006.01)
*H01L 25/065* (2023.01)

(52) U.S. Cl.
CPC ...... *H01L 23/5389* (2013.01); *H01L 25/0655* (2013.01); *H01L 2225/06541* (2013.01)

(58) Field of Classification Search
CPC ... H01L 2225/06541; H01L 2224/0603; H01L 2224/08225; H01L 2924/15192; H01L 2924/15311; G03F 7/70433; G03F 7/70458; G03F 7/70466; G03F 7/203
See application file for complete search history.

(56) References Cited

U.S. PATENT DOCUMENTS

| | | |
|---|---|---|
| 4,904,328 A | 2/1990 | Beecher et al. |
| 4,939,568 A | 7/1990 | Kato et al. |
| 4,998,665 A | 3/1991 | Hayashi |
| 5,087,585 A | 2/1992 | Hayashi |
| 5,236,118 A | 8/1993 | Bower et al. |
| 5,322,593 A | 6/1994 | Hasegawa et al. |
| 5,413,952 A | 5/1995 | Pages et al. |
| 5,418,687 A | 5/1995 | Chen |
| 5,419,806 A | 5/1995 | Huebner |
| 5,442,235 A | 8/1995 | Parrillo et al. |
| 5,489,804 A | 2/1996 | Pasch |
| 5,501,003 A | 3/1996 | Bernstein |
| 5,503,704 A | 4/1996 | Bower et al. |
| 5,504,376 A | 4/1996 | Sugahara et al. |
| 5,516,727 A | 5/1996 | Broom |
| 5,563,084 A | 10/1996 | Ramm et al. |
| 5,610,431 A | 3/1997 | Martin |
| 5,696,406 A | 12/1997 | Ueno |
| 5,734,199 A | 3/1998 | Kawakita et al. |
| 5,753,536 A | 5/1998 | Sugiyama et al. |
| 5,771,555 A | 6/1998 | Eda et al. |
| 5,821,692 A | 10/1998 | Rogers et al. |
| 5,866,942 A | 2/1999 | Suzuki et al. |
| 5,985,739 A | 11/1999 | Plettner et al. |
| 5,998,808 A | 12/1999 | Matsushita |
| 6,008,126 A | 12/1999 | Leedy |
| 6,034,393 A | 3/2000 | Sakamoto et al. |
| 6,054,363 A | 4/2000 | Sakaguchi et al. |
| 6,063,968 A | 5/2000 | Hubner et al. |
| 6,071,761 A | 6/2000 | Jacobs |
| 6,080,640 A | 6/2000 | Gardner et al. |
| 6,097,096 A | 8/2000 | Gardner et al. |
| 6,123,825 A | 9/2000 | Uzoh et al. |
| 6,147,000 A | 11/2000 | You et al. |
| 6,183,592 B1 | 2/2001 | Sylvester |
| 6,218,203 B1 | 4/2001 | Khoury et al. |
| 6,232,150 B1 | 5/2001 | Lin et al. |
| 6,258,625 B1 | 7/2001 | Brofman et al. |
| 6,259,160 B1 | 7/2001 | Lopatin et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,322,600 B1 | 11/2001 | Brewer et al. |
| 6,333,120 B1 | 12/2001 | DeHaven et al. |
| 6,333,206 B1 | 12/2001 | Ito et al. |
| 6,348,709 B1 | 2/2002 | Graettinger et al. |
| 6,355,153 B1 | 3/2002 | Uzoh et al. |
| 6,359,235 B1 | 3/2002 | Hayashi |
| 6,374,770 B1 | 4/2002 | Lee |
| 6,409,904 B1 | 6/2002 | Uzoh et al. |
| 6,423,640 B1 | 7/2002 | Lee et al. |
| 6,465,892 B1 | 10/2002 | Suga |
| 6,515,343 B1 | 2/2003 | Shroff et al. |
| 6,528,894 B1 | 3/2003 | Akram et al. |
| 6,541,382 B1 | 4/2003 | Cheng et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,593,645 B1 | 7/2003 | Shih et al. |
| 6,600,224 B1 | 7/2003 | Farquhar et al. |
| 6,624,003 B1 | 9/2003 | Rice |
| 6,627,814 B1 | 9/2003 | Stark |
| 6,632,377 B1 | 10/2003 | Brusic et al. |
| 6,642,081 B1 | 11/2003 | Patti |
| 6,656,826 B2 | 12/2003 | Ishimaru |
| 6,660,564 B2 | 12/2003 | Brady |
| 6,667,225 B2 | 12/2003 | Hau-Riege et al. |
| 6,720,212 B2 | 4/2004 | Robl et al. |
| 6,759,738 B1 | 7/2004 | Fallon et al. |
| 6,828,686 B2 | 12/2004 | Park |
| 6,837,979 B2 | 1/2005 | Uzoh et al. |
| 6,847,527 B2 | 1/2005 | Sylvester et al. |
| 6,864,585 B2 | 3/2005 | Enquist |
| 6,867,073 B1 | 3/2005 | Enquist |
| 6,887,769 B2 | 5/2005 | Kellar et al. |
| 6,902,987 B1 | 6/2005 | Tong et al. |
| 6,908,027 B2 | 6/2005 | Tolchinsky et al. |
| 6,909,194 B2 | 6/2005 | Farnworth et al. |
| 6,960,492 B1 | 11/2005 | Miyamoto |
| 6,962,835 B2 | 11/2005 | Tong et al. |
| 6,974,769 B2 | 12/2005 | Basol et al. |
| 7,037,755 B2 | 5/2006 | Enquist |
| 7,045,453 B2 | 5/2006 | Canaperi et al. |
| 7,078,811 B2 | 7/2006 | Suga |
| 7,105,980 B2 | 9/2006 | Abbott et al. |
| 7,109,063 B2 | 9/2006 | Jiang |
| 7,109,092 B2 | 9/2006 | Tong |
| 7,126,212 B2 | 10/2006 | Enquist et al. |
| 7,193,239 B2 | 3/2007 | Leedy |
| 7,193,423 B1 | 3/2007 | Dalton et al. |
| 7,247,948 B2 | 7/2007 | Hedler et al. |
| 7,335,572 B2 | 2/2008 | Tong et al. |
| 7,354,798 B2 | 4/2008 | Pogge et al. |
| 7,387,944 B2 | 6/2008 | Tong et al. |
| 7,485,968 B2 | 2/2009 | Enquist et al. |
| 7,553,744 B2 | 6/2009 | Tong et al. |
| 7,750,488 B2 | 7/2010 | Patti et al. |
| 7,803,693 B2 | 9/2010 | Trezza |
| 7,807,549 B2 | 10/2010 | Tong et al. |
| 7,998,335 B2 | 8/2011 | Feeney et al. |
| 8,183,127 B2 | 5/2012 | Patti et al. |
| 8,241,961 B2 | 8/2012 | Kim et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,435,421 B2 | 5/2013 | Keleher et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,507,979 B1 | 8/2013 | Huang et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,742,576 B2 | 6/2014 | Thacker et al. |
| 8,802,538 B1 | 8/2014 | Liu |
| 8,809,123 B2 | 8/2014 | Liu et al. |
| 8,841,002 B2 | 9/2014 | Tong |
| 8,916,448 B2 | 12/2014 | Cheng et al. |
| 8,988,299 B2 | 3/2015 | Kam et al. |
| 9,040,385 B2 | 5/2015 | Chen et al. |
| 9,064,937 B2 | 6/2015 | Edelstein et al. |
| 9,082,627 B2 | 7/2015 | Tong et al. |
| 9,082,644 B2 | 7/2015 | Ossimitz et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |

(56) References Cited

U.S. PATENT DOCUMENTS

| | | |
|---|---|---|
| 9,312,229 B2 | 4/2016 | Chen et al. |
| 9,331,032 B2 | 5/2016 | Liu et al. |
| 9,331,149 B2 | 5/2016 | Tong et al. |
| 9,337,235 B2 | 5/2016 | Chen et al. |
| 9,343,330 B2 | 5/2016 | Brusic et al. |
| 9,343,369 B2 | 5/2016 | Du et al. |
| 9,368,866 B2 | 6/2016 | Yu |
| 9,385,024 B2 | 7/2016 | Tong et al. |
| 9,394,161 B2 | 7/2016 | Cheng et al. |
| 9,425,155 B2 | 8/2016 | Liu et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,472,529 B2 | 10/2016 | Vora |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,666,559 B2 | 5/2017 | Wang et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,859,254 B1 | 1/2018 | Yu et al. |
| 9,865,581 B2 | 1/2018 | Jang et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,129 B2 | 5/2018 | Liu et al. |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,090,351 B2 | 10/2018 | Ashidate et al. |
| 10,103,122 B2 | 10/2018 | Liu et al. |
| 10,147,641 B2 | 12/2018 | Enquist et al. |
| 10,204,893 B2 | 2/2019 | Uzoh et al. |
| 10,211,166 B2 | 2/2019 | Matsuo |
| 10,269,708 B2 | 4/2019 | Enquist et al. |
| 10,269,756 B2 | 4/2019 | Uzoh |
| 10,269,778 B2 | 4/2019 | Lin et al. |
| 10,276,619 B2 | 4/2019 | Kao et al. |
| 10,276,909 B2 | 4/2019 | Huang et al. |
| 10,312,275 B2 | 6/2019 | Hynecek |
| 10,418,277 B2 | 9/2019 | Cheng et al. |
| 10,431,614 B2 | 10/2019 | Gambino et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,672,654 B2 | 6/2020 | Uzoh et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,796,913 B2 | 10/2020 | Lin |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,937,755 B2 | 3/2021 | Shah et al. |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,296,053 B2 | 4/2022 | Uzoh et al. |
| 11,329,034 B2 | 5/2022 | Tao et al. |
| 11,348,898 B2 | 5/2022 | DeLaCruz et al. |
| 11,355,404 B2 | 6/2022 | Gao et al. |
| 11,355,443 B2 | 6/2022 | Huang et al. |
| 11,367,652 B2 | 6/2022 | Uzoh et al. |
| 11,373,963 B2 | 6/2022 | DeLaCruz et al. |
| 11,380,597 B2 | 7/2022 | Katkar et al. |
| 11,385,278 B2 | 7/2022 | DeLaCruz et al. |
| 11,387,202 B2 | 7/2022 | Haba et al. |
| 11,387,214 B2 | 7/2022 | Wang et al. |
| 11,393,779 B2 | 7/2022 | Gao et al. |
| 11,462,419 B2 | 10/2022 | Haba |
| 11,476,213 B2 | 10/2022 | Haba et al. |
| 11,515,291 B2 | 11/2022 | DeLaCruz et al. |
| 11,552,041 B2 | 1/2023 | Fountain, Jr. et al. |
| 11,626,363 B2 | 4/2023 | Haba et al. |
| 11,631,647 B2 | 4/2023 | Haba |
| 2002/0000328 A1 | 1/2002 | Motomura et al. |
| 2002/0003307 A1 | 1/2002 | Suga |
| 2002/0025665 A1 | 2/2002 | Juengling |
| 2002/0074670 A1 | 6/2002 | Suga |
| 2002/0094661 A1 | 7/2002 | Enquist et al. |
| 2002/0113241 A1 | 8/2002 | Kubota et al. |
| 2003/0092220 A1 | 5/2003 | Akram |
| 2003/0109083 A1 | 6/2003 | Ahmad |
| 2003/0129796 A1 | 7/2003 | Bruchhaus et al. |
| 2003/0157748 A1 | 8/2003 | Kim et al. |
| 2004/0072423 A1 | 4/2004 | Jorne et al. |
| 2004/0084414 A1 | 5/2004 | Sakai et al. |
| 2004/0126990 A1 | 7/2004 | Ohta |
| 2004/0157407 A1 | 8/2004 | Tong et al. |
| 2004/0217483 A1 | 11/2004 | Hedler et al. |
| 2004/0262772 A1 | 12/2004 | Ramanathan et al. |
| 2005/0104224 A1 | 5/2005 | Huang et al. |
| 2005/0181542 A1 | 8/2005 | Enquist |
| 2006/0024950 A1 | 2/2006 | Choi et al. |
| 2006/0057945 A1 | 3/2006 | Hsu et al. |
| 2006/0138368 A1 | 6/2006 | Lee |
| 2007/0096294 A1 | 5/2007 | Ikeda et al. |
| 2007/0111386 A1 | 5/2007 | Kim et al. |
| 2007/0212870 A1 | 9/2007 | Yang et al. |
| 2007/0222048 A1 | 9/2007 | Huang |
| 2007/0257366 A1 | 11/2007 | Wang et al. |
| 2007/0295456 A1 | 12/2007 | Gudeman et al. |
| 2008/0122092 A1 | 5/2008 | Hong |
| 2009/0108469 A1 | 4/2009 | Kang et al. |
| 2009/0197408 A1 | 8/2009 | Lehr et al. |
| 2009/0200668 A1 | 8/2009 | Yang et al. |
| 2010/0164066 A1 | 7/2010 | Di Franco |
| 2011/0074040 A1 | 3/2011 | Frank et al. |
| 2011/0290552 A1 | 12/2011 | Palmateer et al. |
| 2012/0211894 A1 | 8/2012 | Aoyagi |
| 2012/0212384 A1 | 8/2012 | Kam et al. |
| 2012/0319280 A1 | 12/2012 | Suganuma et al. |
| 2013/0020704 A1 | 1/2013 | Sadaka |

(56) References Cited

U.S. PATENT DOCUMENTS

| | | |
|---|---|---|
| 2013/0034948 A1 | 2/2013 | Huang et al. |
| 2013/0075900 A1 | 3/2013 | Shim et al. |
| 2013/0078783 A1 | 3/2013 | Nieh et al. |
| 2013/0187287 A1 | 7/2013 | Park et al. |
| 2013/0221527 A1 | 8/2013 | Yang et al. |
| 2013/0256913 A1 | 10/2013 | Black et al. |
| 2013/0284885 A1 | 10/2013 | Chen et al. |
| 2013/0320556 A1 | 12/2013 | Liu et al. |
| 2013/0328186 A1 | 12/2013 | Uzoh et al. |
| 2014/0131869 A1 | 5/2014 | Pendse |
| 2014/0145338 A1 | 5/2014 | Fujii et al. |
| 2014/0175655 A1 | 6/2014 | Chen et al. |
| 2014/0206109 A1 | 7/2014 | Ossimitz et al. |
| 2014/0217593 A1 | 8/2014 | Chen et al. |
| 2014/0225795 A1 | 8/2014 | Yu |
| 2014/0252635 A1 | 9/2014 | Tran et al. |
| 2014/0264948 A1 | 9/2014 | Chou et al. |
| 2014/0332980 A1 | 11/2014 | Sanders et al. |
| 2015/0064498 A1 | 3/2015 | Tong |
| 2015/0096798 A1 | 4/2015 | Uzoh |
| 2015/0097022 A1 | 4/2015 | Di Cioccio et al. |
| 2015/0108644 A1 | 4/2015 | Kuang et al. |
| 2015/0155263 A1 | 6/2015 | Farooq et al. |
| 2015/0200073 A1 | 7/2015 | Jen et al. |
| 2015/0206823 A1 | 7/2015 | Lin et al. |
| 2015/0214191 A1 | 7/2015 | Lee et al. |
| 2015/0228621 A1 | 8/2015 | Kumar et al. |
| 2015/0255417 A1 | 9/2015 | Farooq et al. |
| 2015/0307819 A1 | 10/2015 | Ida et al. |
| 2015/0340269 A1 | 11/2015 | Rivoire et al. |
| 2015/0340371 A1 | 11/2015 | Lue |
| 2015/0364434 A1 | 12/2015 | Chen et al. |
| 2016/0027761 A1 | 1/2016 | Co et al. |
| 2016/0086923 A1 | 3/2016 | Best |
| 2016/0148816 A1 | 5/2016 | Lee et al. |
| 2016/0181228 A1 | 6/2016 | Higuchi et al. |
| 2016/0190103 A1 | 6/2016 | Kabe et al. |
| 2016/0322414 A1 | 11/2016 | Chen et al. |
| 2016/0343682 A1 | 11/2016 | Kawasaki |
| 2017/0053897 A1 | 2/2017 | Lai et al. |
| 2017/0062366 A1 | 3/2017 | Enquist |
| 2017/0179029 A1 | 6/2017 | Enquist et al. |
| 2017/0194271 A1 | 7/2017 | Hsu et al. |
| 2017/0250160 A1 | 8/2017 | Wu et al. |
| 2017/0278698 A1 | 9/2017 | Ikegawa et al. |
| 2017/0358551 A1 | 12/2017 | Liu et al. |
| 2017/0365487 A1 | 12/2017 | Shen et al. |
| 2018/0130784 A1 | 5/2018 | Pagani |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0204798 A1 | 7/2018 | Enquist et al. |
| 2018/0219038 A1 | 8/2018 | Gambino et al. |
| 2018/0226371 A1 | 8/2018 | Enquist |
| 2018/0226375 A1 | 8/2018 | Enquist et al. |
| 2018/0269325 A1 | 9/2018 | Cheng et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337129 A1 | 11/2018 | Li et al. |
| 2018/0350674 A1 | 12/2018 | Uzoh |
| 2019/0057756 A1 | 2/2019 | Kim et al. |
| 2019/0088535 A1 | 3/2019 | Yan et al. |
| 2019/0096741 A1 | 3/2019 | Uzoh et al. |
| 2019/0096842 A1 | 3/2019 | Fountain, Jr. et al. |
| 2019/0109042 A1 | 4/2019 | Katkar et al. |
| 2019/0115277 A1 | 4/2019 | Yu et al. |
| 2019/0131277 A1 | 5/2019 | Yang et al. |
| 2019/0157334 A1 | 5/2019 | Wei et al. |
| 2019/0189603 A1 | 6/2019 | Wang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035630 A1 | 1/2020 | Kameshima |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0321307 A1 | 10/2020 | Uzoh |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0066233 A1 | 3/2021 | Fountain, Jr. et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0005784 A1 | 1/2022 | Gao et al. |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0118156 A1 | 4/2023 | Gao et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |

(56) References Cited

U.S. PATENT DOCUMENTS

| | | | |
|---|---|---|---|
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |

FOREIGN PATENT DOCUMENTS

| | | |
|---|---|---|
| CN | 106920795 A | 7/2017 |
| CN | 107039380 A | 8/2017 |
| CN | 107731668 A | 2/2018 |
| CN | 107993927 A | 5/2018 |
| CN | 107993928 A | 5/2018 |
| CN | 109155301 A | 1/2019 |
| CN | 109417073 A | 3/2019 |
| CN | 109417075 A | 3/2019 |
| CN | 109417077 A | 3/2019 |
| CN | 109643643 A | 4/2019 |
| CN | 109844915 A | 6/2019 |
| EP | 0 465 227 A2 | 1/1992 |
| EP | 2 863 420 A1 | 4/2015 |
| JP | 61-030059 | 2/1986 |
| JP | 01-168040 | 7/1989 |
| JP | 4-259249 | 9/1992 |
| JP | 05-029183 | 2/1993 |
| JP | 5-198739 | 8/1993 |
| JP | 6-13456 | 1/1994 |
| JP | 6-260594 | 9/1994 |
| JP | H07-66093 | 3/1995 |
| JP | H7-249749 | 9/1995 |
| JP | 7-283382 | 10/1995 |
| JP | 8-78645 | 3/1996 |
| JP | 8-125121 | 5/1996 |
| JP | 8-186235 | 7/1996 |
| JP | 9-120979 | 5/1997 |
| JP | 10-135404 | 5/1998 |
| JP | 10-223636 | 8/1998 |
| JP | 10-242383 | 9/1998 |
| JP | 11-186120 | 7/1999 |
| JP | 2000-100679 | 4/2000 |
| JP | 2000-260934 | 9/2000 |
| JP | 2000-299379 | 10/2000 |
| JP | 2000-311982 | 11/2000 |
| JP | 2001-102479 | 4/2001 |
| JP | 2001-326326 | 11/2001 |
| JP | 2002-026123 | 1/2002 |
| JP | 2002-516033 | 5/2002 |
| JP | 2002-353416 | 12/2002 |
| JP | 2002-368159 | 12/2002 |
| JP | 2003-023071 | 1/2003 |
| JP | 2004-200547 | 7/2004 |
| JP | 2005-086089 | 3/2005 |
| JP | 2005-093486 | 4/2005 |
| JP | 2005-135988 | 5/2005 |
| JP | 2013-033786 A | 2/2013 |
| JP | 2013-033900 A | 2/2013 |
| JP | 2013-243333 | 12/2013 |
| JP | 2018-160519 | 10/2018 |
| JP | 2019-129199 | 8/2019 |
| KR | 10-2012-0106366 | 9/2012 |
| KR | 10-2015-0097798 | 8/2015 |
| KR | 20170109865 A | 10/2017 |
| TW | 476145 | 2/2002 |
| WO | WO 01/61743 A1 | 8/2001 |
| WO | WO 03/054954 A2 | 7/2003 |
| WO | WO 2005/043584 A2 | 5/2005 |
| WO | WO 2006/100444 A1 | 9/2006 |
| WO | WO 2012/013162 A1 | 2/2012 |
| WO | WO 2016/185883 A1 | 11/2016 |
| WO | WO 2017/151442 A1 | 9/2017 |
| WO | WO 2017/155002 A1 | 9/2017 |
| WO | WO 2019/146427 A1 | 8/2019 |

OTHER PUBLICATIONS

International Search Report and Written Opinon for PCT Application PCT/US2020/038642 dated Oct. 7, 2020, a counterpart foreign application for U.S. Appl. No. 16/905,766, pp. 1-pp. 13.

Amirfeiz et al., "Formation of silicon structures by plasma-activated wafer bonding," Journal of the Electrochemical Society, 2000, vol. 147, No. 7, pp. 2693-2698.

Appeal Decision of Rejection dated Apr. 12, 2016 in Japanese Patent Application No. 2008-526104, in 14 pages.

Aspar, B. et al., "The smart-cut process: Status and developments," Proc. Electrochem Soc., 1999, vol. 99-53, pp. 48-59.

Bower, R. et al., "Low temperature Si3N4 direct bonding," Appl. Phys. Lett., Jun. 28, 1993, vol. 62, No. 26, pp. 3485-3487.

Bush, Steve, "Electronica: Automotive power modules from on Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Ceramic Microstructures: Control at the Atomic Level, Recent Progress in Surface Activated Bonding, 1998, pp. 385-389.

"Chemical Mechanical Polishing (CMP) Metrology with Advanced Surface Polisher," Park Systems, 4 pages.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

D'Agostino, R., "Plasma etching of Si and SiO2 in SF6—O2 mixtures," J. Appl. Phys., Jan. 1981, vol. 52, No. 1, pp. 162-167.

Decision—Request for Trail Granted, Inter Partes Review, U.S. Pat. No. 7,485,968, Case IPR2013-00381, dated Dec. 18, 2013, in 27 pages.

Declaration of Richard A. Blanchard in Support of Petition for inter partes review of U.S. Pat. No. 7,485,968, dated Jun. 13, 2013, pp. 1-18.

Derbyshire, Katherine, "The darker side of hybrid bonding," Semiconductor Engineering, Dec. 17, 2020, https://semiengineering.com/author/katherine/, 6 pages.

Dysard, Jeffrey M. et al., "CMP solutions for the integration of high-k metal gate technologies," ECS Transactions, 2010, vol. 33, Issue 10, pp. 77-89.

Fan et al., "Copper wafer bonding," Electrochem. Solid-State Lett., U.S.A., The Electrochemical Society, Aug. 6, 1999, vol. 2, No. 10, pp. 534-536.

Fang, S.J. et al., "Advanced process control in dielectric chemical mechanical polishing (CMP)," Texas Instruments, Silicon Technology Development, 8 pages.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Final Written Decision, Inter PartesReview, U.S. Pat. No. 7,485,968, Case IPR2013-00381, dated Feb. 27, 2014, in 3 pages.

Gao, Guilian et al., "Scaling package interconnects below 20 m pitch with hybrid bonding," 2018 IEEE 68th Electronic Components and Technology Conference (ECTC), IEEE, May 29, 2018, pp. 314-322, XP033380016.

Gösele et al., "Semiconductor Wafer Bonding: A flexible approach to materials combinations in microelectronics; micromechanics and optoelectronics," IEEE, 1997, pp. 23-32.

Gösele et al., "Silicon layer transfer by wafer bonding," Proceedings of the Second International Symposium on Semiconductor Wafer Bonding: Science, Technology and Applications, The Electrochemical Society Proceedings, vol. 93-29 (1993), pp. 395-409.

(56) References Cited

OTHER PUBLICATIONS

Handbook of Thin Film Technology, Maissel and Glang, 1983 Reissue, pp. 12-24.
Harendt, C. et al., "Vertical polysilicon interconnects by aligned wafer bonding," Electrochemical Society Proceedings, 1998, vol. 97-36, pp. 501-508.
Hayashi, Y. et al., "Fabrication of three-dimensional IC using cumulatively bonded IC (Cubic) technology," VSLI Tech. Dog., 1990, pp. 95-96.
Hizukuri, M. et al., "Dynamic strain and chip damage during ultrasonic flip chip bonding," Jpn. J. Appl. Phys. 40, 2001, pp. 3044-3048.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7.
Howlader et al., "Bonding of p-Si/n-InP wafers through surface activated bonding method at room temperature," Indium Phosphide and Related Materials, 2001, IEEE International Conference on, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
"Hybrid Bonding—Patent Landscape Analysis," from Technologies to IP Business Intelligence, KnowMade Patent & Technology Intelligence, www.kmowmade.com, Nov. 2019, 81 pages.
Hymes, S. et al., "Determination of the planarization distance for copper CMP process," 6 pages.
Iida, A. et al., "The study of initial mechanism for Al—Au solid phase diffusion flip-chip bonding," Jpn. J. Appl. Phys. 40, 1997, pp. 3044-3661.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Juang, Jing-Ye et al., "Copper-to-copper direct bonding on highly (111)-oriented nanotwinned copper in no-vacuum ambient," Scientific Reports, Sep. 17, 2018, vol. 8, 11 pages.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.

Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Kissinger, G. et al., "Void-free silicon-wafer-bond stregthening in the 200-400 C range," Sensors and Actuators A, 1993, vol. 36, pp. 149-156.
Krauter, G. et al., "Low temperature silicon direct bonding for application in micromechanics: bonding energies for different combinations of oxides," Sensors and Actuators A, 1998, vol. 70, pp. 271-275.
Kunio, Takemitsu, "Three dimensional IC technology, using cubic method," Journal of the JWS, Japan Welding Society, Apr. 5, 1994, vol. 63, No. 3, pp. 185-189.
Lee, D. et al., "Slurry components in metal chemical mechanical planarization (CMP) process: A review," International Journal of Precision Engineering and Manufacturing, Dec. 2016, vol. 17, No. 12, pp. 1751-1762.
Li, Yuzhuo, "Key factors that influence step height reduction efficiency and defectivity during metal CMP," Clarkson University, Levitronix CMP Users' Conference 2006, 2006, 32 pages.
Li, Y.A. et al., "Low temperature copper to copper direct bonding," Jpn. Appl. Phys. 37, 1998, pp. L1068-L1069.
Li, Y.A. et al., "Systematic low temperature silicon bonding using pressure and temperature," Jpn. J. Appl. Phys., vol. 37, 1998, pp. 737-741.
Liu, Zi-Yu et al. "Detection and formation mechanism of microdefects in ultrafine pitch Cu—Cu direct bonding," Chin. Phys. B, 2016, vol. 25, No. 1, pp. 018103-1-018103-7.
Liu, C. et al., "Low-temperature direct copper-to-copper bonding enabled by creep on (111) surfaces of nanotwinned Cu," Scientific Reports, May 12, 2015, 5:09734, pp. 1-11.
Lu, L. et al., "Grain growth and strain release in nanocrystalline copper," Journal of Applied Physics, vol. 89, Issue 11, pp. 6408.
Luo, Ying, "Slurry Chemistry Effects on Copper Chemical Mechanical Planarization," University of Central Florida STARS, Electronic Theses and Disserations, 2004, Paper 36, 111 pages.
Matsuzawa et al., "Room-temperature interconnection of electroplated Au microbump by means of surface activated bonding method," Electornic Components and Technology Confererence, 2001, 51st Proceedings, IEEE, pp. 384-387.
Monsma et al., "Development of the spin-valve transistor," IEEE Tran. Magnet., vol. 33, No. 5, Sep. 1997, pp. 3495-3499.
Moriceau, H. et al., "Overview of recent direct wafer bonding advances and applications," Advances in Natural Sciences-Nanoscience and Nanotechnology, 2010, 11 pages.
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
Mott, D. et al., "Synthesis of size-controlled and shaped copper nanoparticles," Langmuir, 2007, vol. 23, No. 10, pp. 5740-5745.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (l), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Onsemi AR0820 image, cross section of a CMOS image sensor product. The part in the image was shipped on Sep. 16, 2021. Applicant makes no representation that the part in the image isidentical to the part identified in the separately submitted reference BUSH, Nov. 8, 2018, ElectronicsWeekly.com ("BUSH article"); however, the imaged part and the part shown in the BUSH article share the part number "ONSEMI AR0820."

(56) References Cited

OTHER PUBLICATIONS

Ortleb, Thomas et al., "Controlling macro and micro surface topography for a 45nm copper CMP process using a high resolution profiler," Proc. of SPIE, 2008, vol. 6922, 11 pages.

Paul, E. et al., "A model of copper CMP," J. Electrochem. Soc., 2005, vol. 152, Issue 4, pp. G322-G328.

Petition for Inter Partes Review of U.S. Pat. No. 7,485,968, IPR 2013-00381, filed Jun. 21, 2013, pp. 1-49.

Plobi, A. et al., "Wafer direct bonding: tailoring adhesion between brittle materials," Materials Science and Engineering Review Journal, 1999, R25, 88 pages.

Reiche et al., "The effect of a plasma pretreatment on the Si/Si bonding behaviouir," Electrochemical Society Proceedings, 1998, vol. 97-36, pp. 437-444.

Rhoades, Robert L., "The Dark Art of CMP," Future Fab International, Issue 24, 10 pages.

Roberds et al., "Low temperature, in situ, plasma activated wafer bonding," Electrochemical Society Proceedings, 1997, vol. 97-36, pp. 598-606.

Rosales-Yeomans, D. et al., "Evaluation of pad groove designs under reduced slurry flow rate conditions during copper CMP," Journal of the Electrochemical Society, 2008, vol. 155, No. 10, pp. H812-H818.

Samsung Galaxy S7 Edge Teardown, posted Apr. 24, 2016, contributing authors: Jim Morrison, Ray Fontaine, Dick James and Daniel Yang, https://www.techinsights.com/blog/samsung-galaxy-s7-edge-teardown, last accessed on May 16, 2022, 6 pages.

Sart C., et al., "Cu/SiO2 hybrid bonding; Finite element modeling and experimental characterization," 2016 6th Electronic System-Integration Technology Conference (ESTC), IEEE, Sep. 13, 2016, pp. 1-7, XP033015798.

Schmidt, Martin A., Wafer-To-Wafer Bonding for Microstructure Formation, Proceedings of the IEEE, vol. 86, No. 8, 1998, pp. 1575-1586.

Shigetou et al., "Cu—Cu direct bonding for bump-less interconnect," Research Center for Advanced Science and Technolog., University of Tokyo, Optoelectronic Packaging and Solder Bumps, (2002), pp. 628-639.

Shigetou et al., "Room temperature bonding of ultra-fine pitch and low-profiled Cu electrodes for bump-less interconnect," 2003 Electronic Components and Technology Conference, pp. 848-852.

Shigetou et al., "Room-temperature direct bonding of CMP—Cu film for bumpless interconnection," Electronic Components and Technology Confererence, 51st Proceedings, 2001, IEEE, pp. 755-760.

Shimatsu, T. et al., "Metal bonding during sputter film deposition," J. Vac. Sci. Technol. A 16(4), 1998, pp. 2125-2131.

Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."

Steinkirchner, J. et al., "Silicon wafer bonding via designed monolayers," Advanced Materials, 1995, vol. 7, No. 7, 7 pages.

Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.

Suga et al., "A new bumping process using lead-free solder paste," Electronics Packaging Manufacturing, IEEE Transactions on (vol. 25, Issue 4), IEEE, Oct. 2002, pp. 253-256.

Suga et al., "A new wafer-bonder of ultra-high precision using surface activated bonding (SAB) concept," Electronic Components and Technology Conference, 2001, IEEE, pp. 1013-1018.

Suga et al., "Bump-less interconnect for next generation system packaging," Electronic Components and Technology Conference, 2001, IEEE, pp. 1003-1008.

Suga et al., "Surface activated bonding—an approach to joining at room temperature," Ceramic Transactions: Structural Ceramics Joining II, The American Ceramic Society, 1993, pp. 323-331.

Suga et al., "Surface activated bonding for new flip chip and bumpless interconnect systems," Electronic Components and Technology Conference, 2002, IEEE, pp. 105-111.

Suga, "UHV room temperature joining by the surface activated bonding method," Advances in science and technology, Techna, Faenza, Italie, 1999, pp. C1079-C1089.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.

Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.

Takagi et al., "Effect of surface roughness on room-temperature wafer bonding by Ar beam surface activation," Japanese Journal of Applied Physics, 1998, vol. 37, Part 1, No. 1, pp. 4197.

Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.

Takagi et al., "Room temperature silicon wafer direct bonding in vacuum by Ar beam irradiation," Micro Electro Mehcanical Systems, MEMS '97 Proceedings, 1997, IEEE, pp. 191-196.

Takagi et al., "Room-temperature bonding of lithium niobate and silicon wafers by argon-beam surface activation," Appl. Phys. Lett., 1999. vol. 74, pp. 2387.

Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.

Takagi et al., "Room-temperature wafer bonding of silicon and lithium niobate by means of arbon-beam surface activation," Integrated Ferroelectrics: An International Journal, 2002, vol. 50, Issue 1, pp. 53-59.

Takagi et al., "Surface activated bonding silicon wafers at room temperature," Appl. Phys. Lett. 68, 2222 (1996).

Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.

Tong et al., "Low temperature wafer direct bonding," Journal of Microelectromechanical Systems, IEEE Service Center, Piscataway, NJ, vol. 3, No. 1, Mar. 1, 1994, pp. 29-35, XP-000885425, ISSN 1057-7157.

Tong, Q.Y. et al., "Semiconductor wafer bonding," Materials Chemistry and Physics, R25, 1999, 239 pages (exerpts).

Tong, Q.Y. et al., "Semiconductor wafer bonding: recent developments," Materials Chemistry and Physics, vol. 37, 1994, pp. 101-127.

Tong, Q.Y. et al., "Semiconductor wafer bonding: science and technology," 1999, 120 pages.

Tong, Q.Y. et al., "Semiconductor wafer bonding: science and technology," 1999, 159 pages.

Tong, Q.Y. et al., "Wafer bonding and layer splitting for microsystems," Advanced Materials, 1999, vol. 11, No. 17, pp. 1409-1425.

(56) References Cited

OTHER PUBLICATIONS

Topol et al., "Enabling technologies for wafer-level bonding of 3D MEMS and integrated circuit structures," 2004 Electronics Components and Technology Conference, 2004 IEEE, pp. 931-938.
Tsau et al., "Fabrication process and plasticity of gold-gold thermocompression bonds," Mater. Soc. Symp. Proc. 605, 171 (1999).
Tsau, C.H. et al., "Characterization of low temperature wafer-level gold—gold thermocompression bonds," Mater. Soc. Symp. Proc. 605, 1999, pp. 171-176.
Vossen, J. et al., "Thin Film Processes II," Academic Press, 1991, 62 pages.
Vossen, J. et al., "Thin Film Processes," Academic Press, 1978, 62 pages.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Warner, K. et al., "Low-temperature oxide-bonded three-dimensional integrated circuits," IEEE International SOI Conference, Oct. 2012, pp. 123-125.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Wikipedia, "Chemical bond," URL http://en.wikipedia.org/wiki/chemical_bond, accessed on Mar. 31, 2010, 10 pages.
Wikipedia, "Van der Waals force," URL https://en.wikipedia.org/wiki/Van_der_Waals_force, originally accessed on Mar. 31, 2010, 7 pages.
Xu et al., "New Au—Al interconnect technology and its reliability by surface activated bonding," Electronic Packaging Technology Proceedings, Oct. 28-30, 2003, Shanghai, China, pp. 479-483.
Yablonovitch, E. et al., "Van der Waals bonding of GaAs on Pd leads to a permanent, solid-phase-topotaxial metallurgical bond," Appl. Phys. Lett. 59, 1991, pp. 3159-3161.
Image showing a partial cross-section of Sony IMX260 BSI image sensor from Samsung Galaxy S7; product believed to be released Mar. 2016.
Image showing a partial cross-section of Omnivision OV16B10 16MP BSI image sensor from Huawei P20 Lite Phone; product believed to be released May 2018.

400

```
┌─────────────────────────────────────────────────────────────┐
│ PERFORM, BY A STEPPER APPARATUS, A FIRST EXPOSURE OPERATION ON A │
│ FIRST LAYER OF A WAFER WITH RESPECT TO A FIRST ACTIVE REGION OF A FIRST │
│           BASE DIE DEFINED IN THE WAFER                     │
│                           402                               │
└─────────────────────────────────────────────────────────────┘
                              ↓
┌─────────────────────────────────────────────────────────────┐
│ MOVE A RETICLE OF THE STEPPER APPARATUS OVER A SECOND ACTIVE REGION │
│          OF A SECOND BASE DIE DEFINED IN THE WAFER          │
│                           404                               │
└─────────────────────────────────────────────────────────────┘
                              ↓
┌─────────────────────────────────────────────────────────────┐
│ PERFORM, BY THE STEPPER APPARATUS, THE FIRST EXPOSURE OPERATION ON │
│ THE FIRST LAYER OF THE WAFER WITH RESPECT TO THE SECOND ACTIVE REGION │
│         OF THE SECOND BASE DIE DEFINED IN THE WAFER         │
│                           406                               │
└─────────────────────────────────────────────────────────────┘
                              ↓
┌─────────────────────────────────────────────────────────────┐
│ PERFORM, BY AN ALIGNER APPARATUS, A SECOND EXPOSURE OPERATION ON │
│ THE FIRST LAYER OF THE WAFER WITH RESPECT TO A FIRST INACTIVE REGION OF │
│ THE FIRST BASE DIE DEFINED IN THE WAFER AND A SECOND INACTIVE REGION OF │
│          THE SECOND BASE DIE DEFINED IN THE WAFER           │
│                           408                               │
└─────────────────────────────────────────────────────────────┘
```

FIG. 4

MIXED EXPOSURE FOR LARGE DIE

CROSS-REFERENCE TO RELATED APPLICATION

This patent application claims priority to U.S. Utility patent application Ser. No. 17/075,489, filed Oct. 20, 2020, which is fully incorporated herein by reference.

BACKGROUND

In microelectronic devices, electronic circuits are fabricated on a wafer of semiconductor material, such as silicon. The wafer with electronic circuits may be bonded to one or more other wafers, bonded to individual dies, or itself diced (singulated) into numerous dies, each die containing a copy of the circuit. Each die that has a functional integrated circuit is known as a microchip or "chip." When specific functions from a library of functions are assigned to individual chips, or when a large monolithic chip is emulated by a collection of smaller chips, these smaller chips, or chips with specific or proprietary functions, may be referred to as "chiplets." As used herein, unless otherwise indicated, chiplet means a complete subsystem (intellectual property core) (IP core), a reusable unit of logic, memory and/or other circuitry, on a single die. A library of chiplets may provide routine or well-established IP-block functions.

Large composite base dies, e.g., interposers, of microelectronic devices generally include multiple chiplets made up of multiple layers. The large composite dies may be defined within a wafer during manufacturing of the microelectronic devices.

In order to process the multiple layers, multiple mask sets are required. A stepper apparatus may be used to expose the multiple mask sets, layer by layer. However, often the reticle of the stepper apparatus is smaller than the size of the composite base die. Indeed, "large" generally refers to a base die that is bigger in area than the reticle. Thus, multiple passes of the wafer through the stepper apparatus are required and reticle stitching is needed. This is a time consuming and expensive process. Additionally, it can be possible to utilize multiple stepper apparatuses. However, stepper apparatuses are extremely expensive and thus, it is generally not practical to include multiple stepper apparatuses.

BRIEF DESCRIPTION OF THE DRAWINGS

The detailed description is set forth below with reference to the accompanying figures. In the figures, the left-most digit(s) of a reference number identifies the figure in which the reference number first appears. The use of the same reference numbers in different figures indicates similar or identical items. The systems depicted in the accompanying figures are not to scale and components within the figures may be depicted not to scale with each other.

FIG. 4 illustrates a flow diagram of an example method for performing exposure operations on the wafer of FIG. 1 utilizing both a stepper apparatus and an aligner apparatus.

DESCRIPTION OF EXAMPLE EMBODIMENTS

Overview

Figure 1:
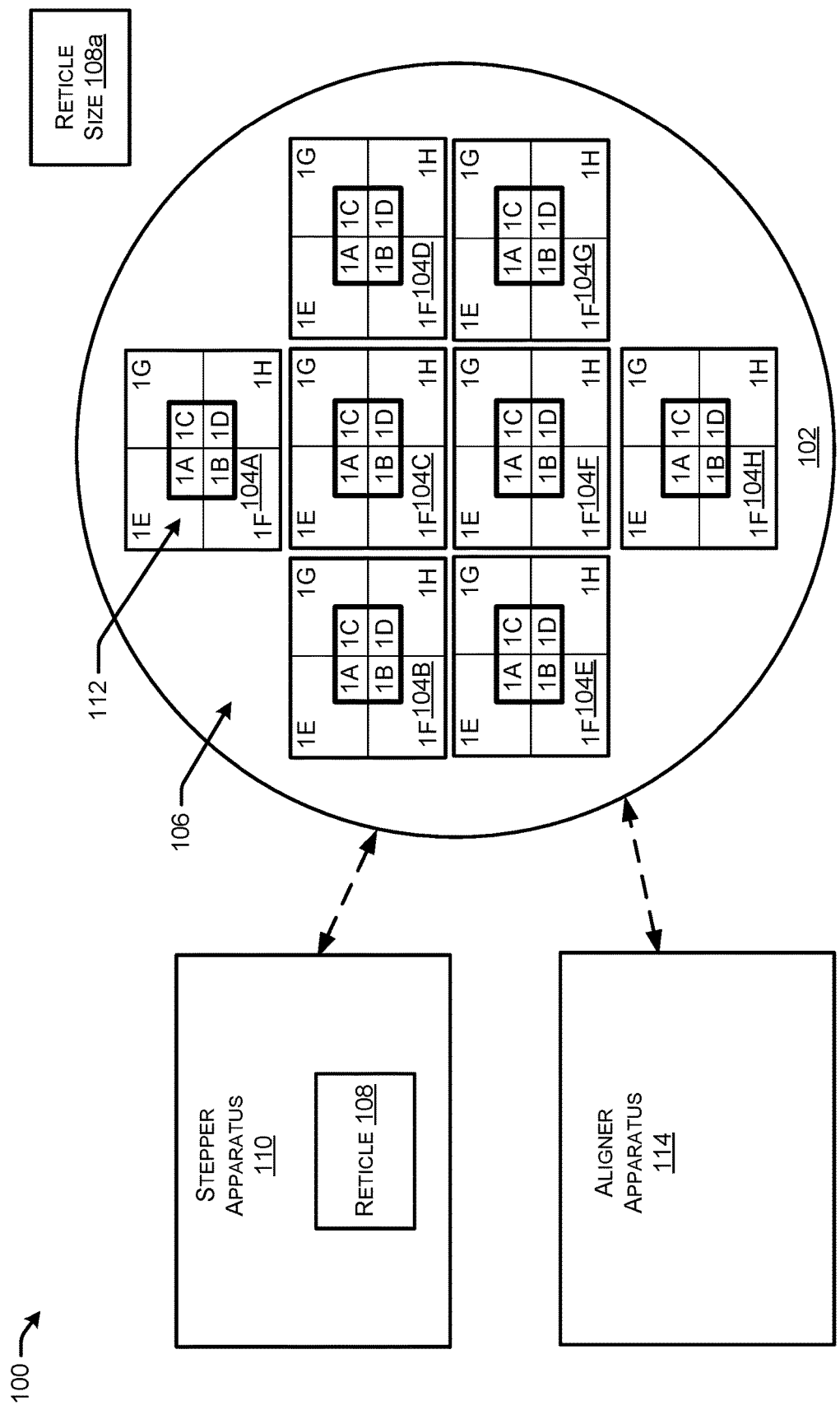
FIG. 1 is a schematic diagram depicting an example illustrative layout of a wafer with composite base dies defined therein for use in microelectronic devices.
Figure 2A:
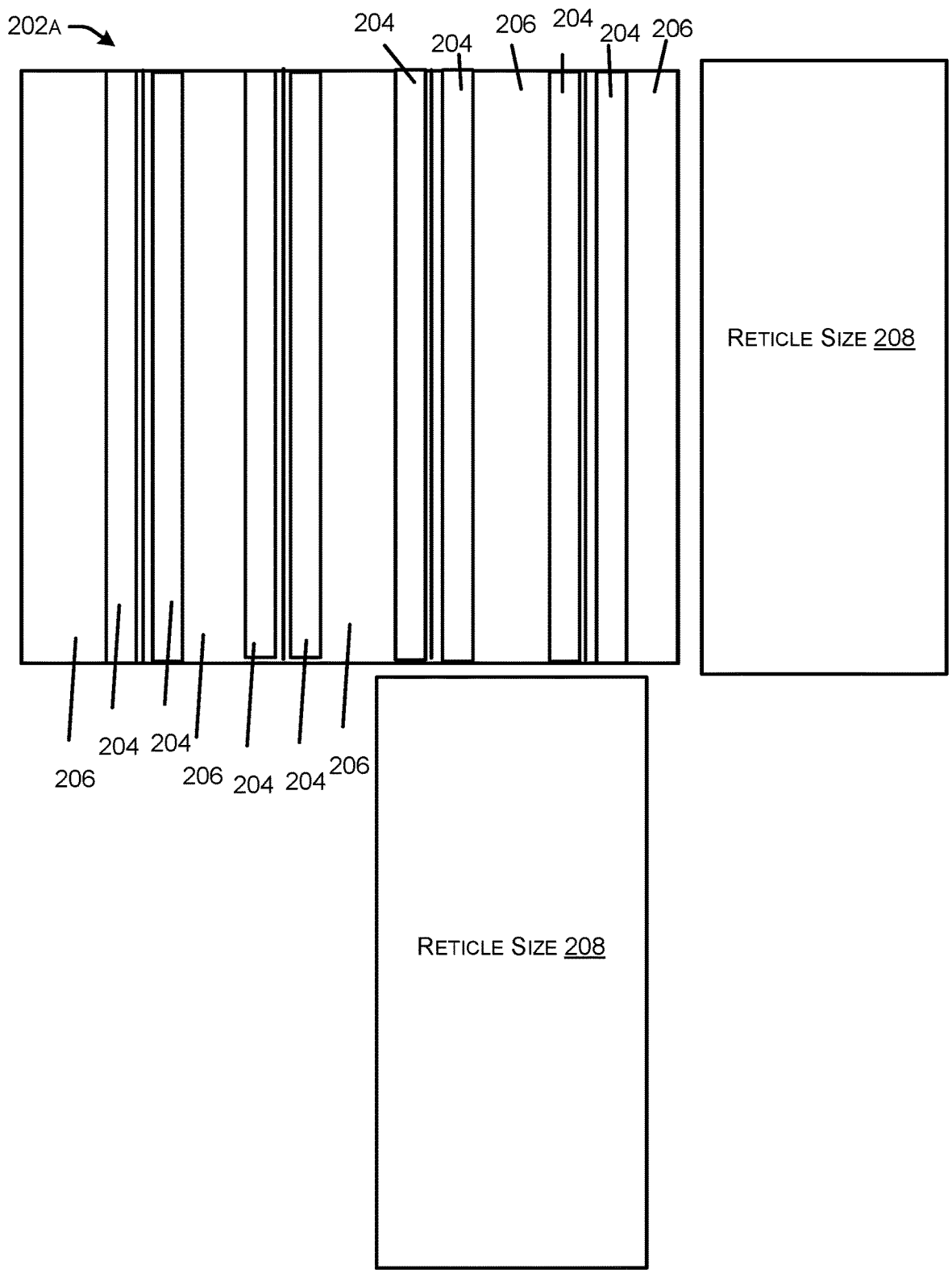
FIGS. 2A-2E schematically illustrate example alternative layouts of composite base dies with respect to active regions and inactive regions.
Figure 2B:
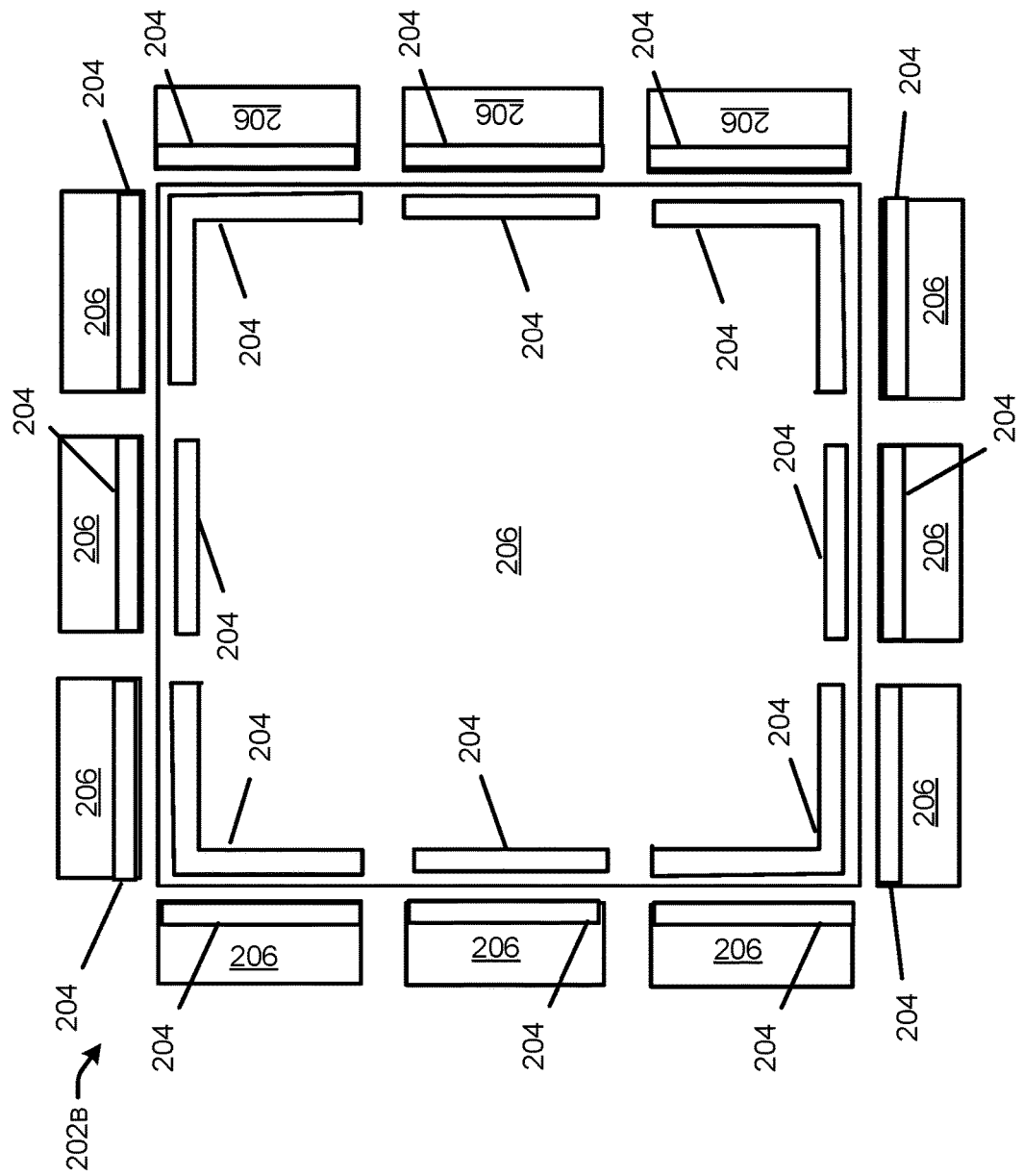
Figure 2C:
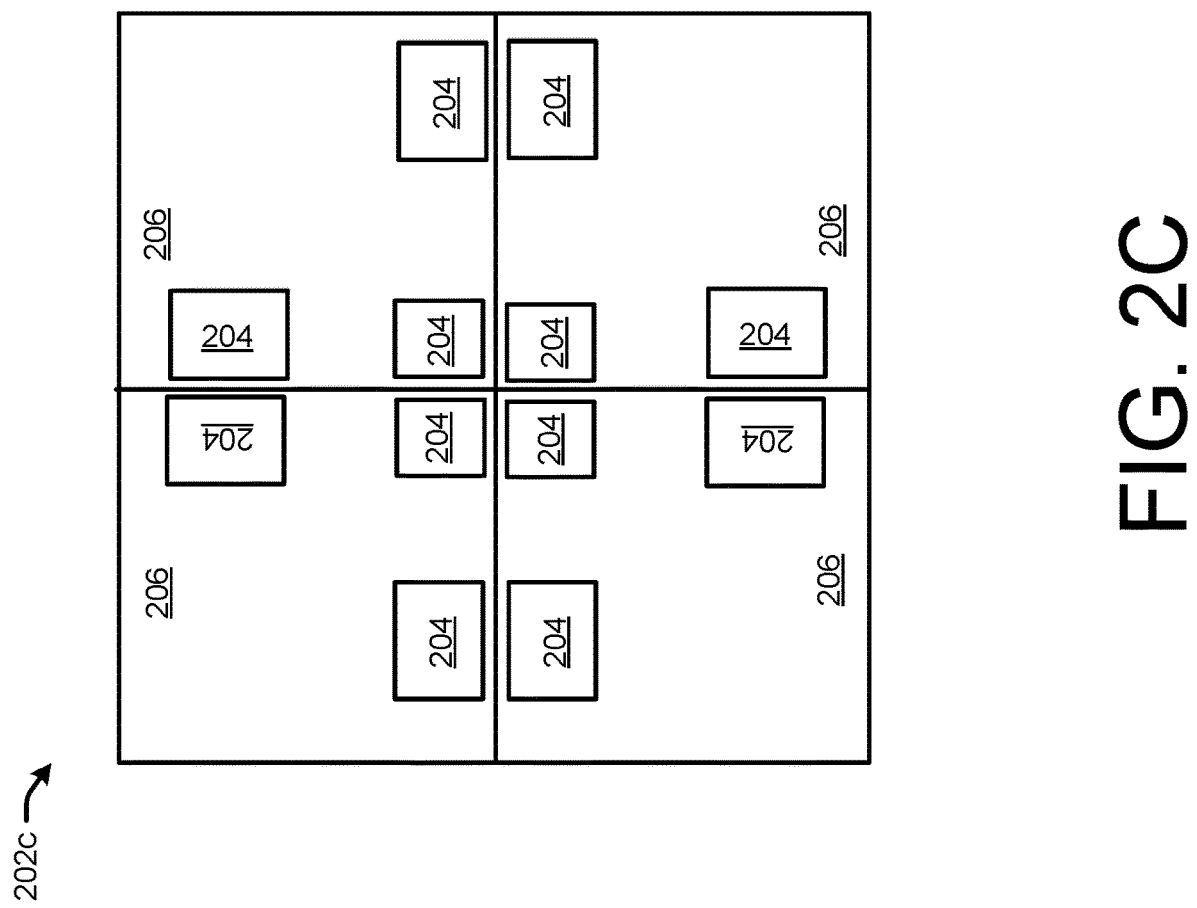
Figure 2D:
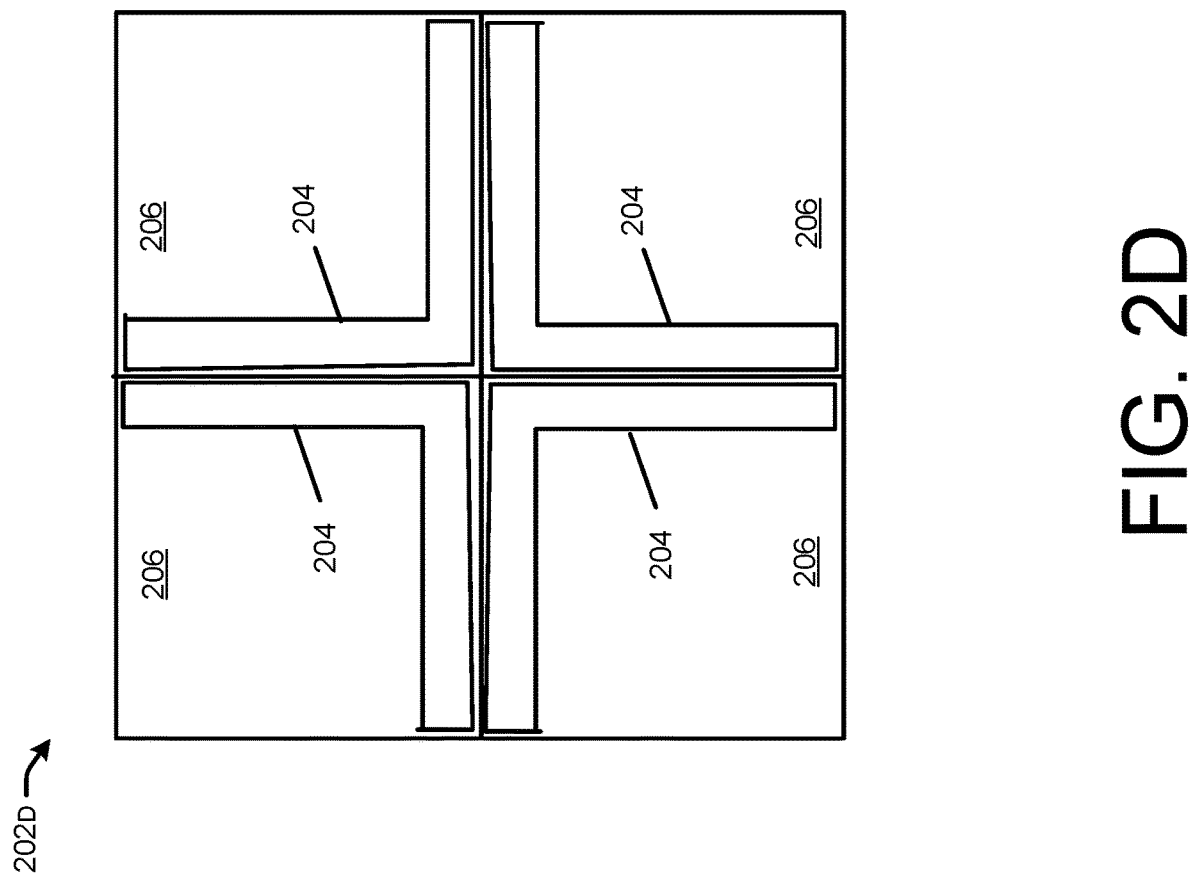
Figure 2E:
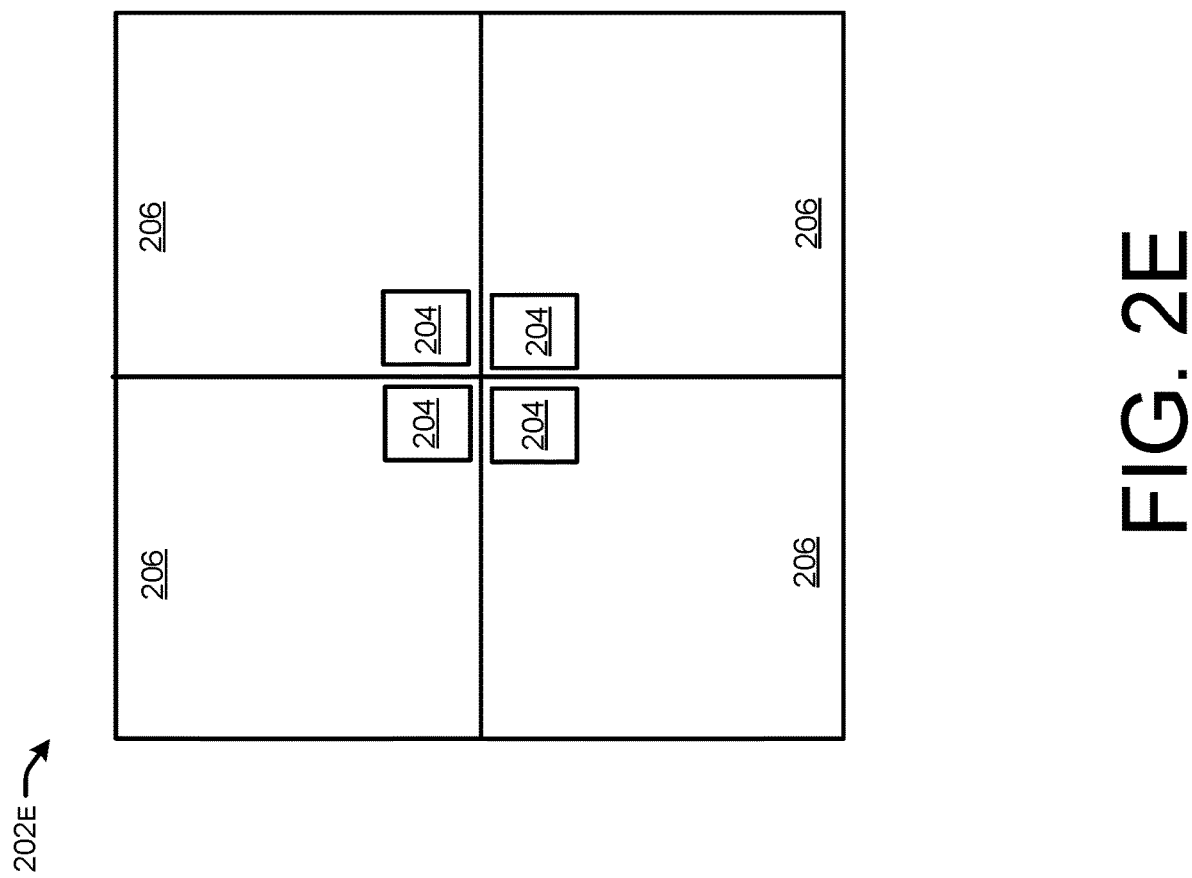

This disclosure describes example techniques and arrangements for performing exposure operations on a wafer utilizing both a stepper apparatus and an aligner apparatus. The exposure operations are performed with respect to large composite base dies, e.g., interposers, defined within the wafer, where the interposers will become a part of microelectronic devices by coupling with active dies or microchips. The composite base dies may be coupled to the active dies via "native interconnects" or "native interfaces" utilizing direct bonding techniques.

"Direct-bonding" as used herein means direct-contact metal-to-metal bonding, oxide bonding, or fusion bonding between two metals, such as copper to copper (Cu—Cu) metallic bonding between two copper conductors in direct contact, with at least partial crystal lattice cohesion. Such direct-bonding may be provided by a hybrid bonding technique such as DBI®. (direct bond interconnect) technology to be described below, and other metal bonding techniques (Invensas Bonding Technologies, Inc., an Xperi Corporation company, San Jose, Calif.). "Core" and "core-side" as used herein mean at the location, signal, and/or level present at the functional logic of a particular die, as opposed to at the location, signal, and/or level of an added standard interface defined by a consortium. Thus, a signal is raw or "native" if it is operational at the core functional logic level of a particular die, without certain modifications, such as additional serialization, added electrostatic discharge (ESD) protection except as inherently provided by the particular circuit; has an unserialized data path, can be coupled across dies by a simple latch, flop, or wire, has no imposed input/output (I/O) protocols, and so forth. A native signal, however, can undergo level shifting, or voltage regulation for purposes of adaptation between dies of heterogeneous foundry origin, and still be a native signal, as used herein. "Active" as used herein (active base die) accords with the usual meaning of active in the semiconductor arts, as opposed to "passive." Active components include transistor logic and amplifying components, such as the transistors. Passive components, on the other hand, do not introduce net energy into a circuit, and do not use an original source of power, except for power derived from other circuits connected to the passive circuit.

DBI bonding may be utilized for fine-pitch bonding in integrated circuit assembly, and can be applied to bond the die to the interconnect area. See for example, U.S. Pat. No. 7,485,968, which is incorporated by reference herein in its entirety. DBI bonding technology has also been demonstrated down to lower pitches in wafer-to-wafer approaches that do not have this individual die pitch limitation with the pick-and-place (P&P) operation (Pick & Place surface-mount technology machines). With DBI technology, under bump metalization (UBM), underfill, and micro-bumps are replaced with a DBI metalization layer. Bonding at die level is initiated at room temperature followed by a batch anneal at low temperature. ZiBond® direct bonding may also be used in some circumstances ((Ziptronix, Inc., an Xperi Corporation company, San Jose, Calif.).

In some configurations, the interconnects may be referred to as "direct-bonded native interconnects" that are metal-to-metal bonds formed directly between native conductors of a die and conductors of a second die, thereby forgoing the need for the complexity and overhead of standard interfaces. A native conductor of a die is an electrical conductor that has electrical access to the raw or native signal of the die, operational at the level of the core functional logic of the particular die, without significant modification of the signal for purposes of interfacing with other dies. The native interconnects for conducting such native signals from the core-side of a die can provide continuous circuits disposed through two or more cross-die boundaries without amplifying or modifying the native signals, except as desired to accommodate dies from different manufacturing processes. From a signal standpoint, the native signal of the IP core of one die is passed directly to other dies via the directly bonded native interconnects, with no modification of the native signal or negligible modification of the native signal, thereby forgoing standard interfacing and consortium-imposed input/output protocols. For example, the native interconnects described in U.S. Pat. No. 10,522,352, issued Dec. 31, 2019, entitled "Direct-Bonded Native Interconnects and Active Base Die", which is incorporated by reference in its entirety, may be utilized according to some configurations.

The composite base dies on the wafer include active regions and inactive (passive) regions. The use of native interconnects to couple a composite base die to an active die in a microelectronic device requires a fine pitch in the active regions of the composite base dies. For example, the active regions may require a pitch in a range of one to 10 microns. In some configurations, the pitch may be less than one micron. In other configurations, the pitch may be in a range of 10 to 100 microns. The inactive regions generally only require a pitch of 130 microns and above. In some configurations, the pitch in the inactive regions may be 100 microns and above.

In configurations, the stepper apparatus may be utilized to expose (e.g., perform a lithographic operation on) active regions of composite base dies on the wafer. Thus, for a first layer of the base die, the stepper apparatus may expose an active region of a first large composite die defined in the wafer. The reticle of the stepper apparatus may then be moved or "overstep" to a second composite base die defined in the wafer. The stepper apparatus may then expose active regions in the first layer of the second base die. The process may repeat until all of the composite base die active regions of all of the composite base dies defined in the wafer have been exposed in the first layer. In configurations, if multiple active regions fit within the stepper apparatus' reticle, then multiple active regions of a composite base die or composite base dies may be exposed and then the stepper apparatus may overstep and move the reticle to another set of active regions for exposure. In configurations, the aligner apparatus may be utilized to expose (e.g., perform a lithographic operation on) inactive regions of the composite base dies defined in the wafer. As is known, generally the wafer fits entirely within the aligner apparatus. Thus, all of the inactive regions of the composite base dies defined in the wafer may be exposed in the first layer with one single operation of the aligner. In some configurations, more than one aligner operation may be needed to expose all of the inactive regions of the composite base dies defined in the wafer. Use of both the stepper apparatus and the aligner apparatus results in no reticle stitching being required. Once the exposure operations have been performed in a layer, exposed areas may be etched.

Once the active regions and the inactive regions of the composite base dies defined in the wafer have been exposed and etched in the first layer, the process may be repeated for a second layer, a third layer, etc. Generally, other operations may be performed in addition to the exposure and etching operations of the various layers. For example, a resist may be applied to the layers of the wafer. In configurations, an antireflective coating may be applied to the entire wafer. The stepper apparatus may then be utilized to expose the active circuitry within the composite base dies as previously described. For example, the stepper apparatus may expose an active region within the first layer of a first composite base die and then the reticle may be moved, e.g., overstepped, to an active region of the second composite base die defined within the wafer. The stepper apparatus may then perform an exposure operation for the active region of the second composite base die. In configurations, the aligner apparatus may be used first to provide a pattern for alignment features for the stepper apparatus.

The wafer may then be processed using the aligner apparatus, e.g., the aligner apparatus may perform an exposure operation for the composite base dies defined in the wafer for the inactive regions, e.g., for the various features in the inactive regions including through silicon vias (TSVs). In configurations, TSVs in the active regions (via in the middle) may be exposed by the aligner apparatus. In some configurations, TSVs in the active regions (via in the middle) by the stepper apparatus in later exposure operations by the stepper apparatus.

After the aligner apparatus is used for exposure operations in the first layer, an etch/pattern operation may be performed by an appropriate apparatus. A cleaning operation may also be performed. In configurations, the first layer may be an implant layer and thus, implant operations may then be performed, e.g., a n-doping or a p-doping implantation operation may be performed. Masks may then be stripped and a further cleaning operation may then be performed. The process may then be repeated for a second layer, third layer, etc., depending on the number of implant layers. Once the implant layers are completed, then subsequent layers, e.g., metal layers, may be processed in a similar manner. In configurations, there may be additional operations performed not discussed herein. The operations discussed herein are merely examples and are not meant to be limiting.

Additionally, the order of the steps may be varied. For example, there could be negative or positive resists applied. Also, the stepper apparatus may expose active regions of a first layer and then the etching process may be performed for the exposed active regions in the first layer. The aligner apparatus may then expose inactive regions in the first layer and then the etching process may be performed before other operations are performed.

EXAMPLE EMBODIMENTS

FIG. 1 is a schematic diagram 100 depicting an example illustrative layout of a wafer 102 with composite base dies 104a-104h (referred to herein singularly or collectively as 102) defined therein. In configurations, the wafer 102 may have more or fewer composite base dies 104 defined therein depending on the size of the composite base die 104. The composite base dies 104 include active regions 1A, 1B, 1C, and 1D that are located on a corner of each composite base die 102. Each composite die 104 also includes inactive regions 1E, 1F, 1G, and 1H. FIGS. 2A-2E schematically illustrate example alternative layouts of composite base dies 202a, 202b, 202c, 202d, and 202e with respect to active regions 204 and inactive regions 206, which correspond to active regions 1A, 1B, 1C, and 1D and inactive regions 1E, 1F, 1G, and 1H, respectively. As may be seen in FIG. 2E, the composite base dies 104 illustrated in FIG. 1 have a layout at least similar to the layout of composite base die 202e. However, the composite base dies 104 may have a different layout, including, but not limited to, the example layouts illustrated in FIGS. 2A-2D.

Referring back to FIG. 1, areas 106 of the wafer 102 that do not include any of the composite base dies 104 do not require exposure. Box 108a illustrates a reticle size of a reticle 108 of a stepper apparatus 110. As can be seen from box 106, the reticle 108 is larger than the sections 112 that include an active region and an inactive region, e.g., active region 1A and inactive region 1E, of the composite base dies 104, but the composite base dies 104 are larger than the reticle 108. Thus, the composite base dies 104 may be referred to as "large" composite base dies 104 since they are larger than the reticle 108.

In configurations, the stepper apparatus 110 may be utilized to expose (e.g., perform a lithographic operation on) just the active regions 1A, 1B, 1C, and 1D of the composite base dies 104 using the reticle 108. Thus, for example, the reticle 108 of the stepper apparatus 110 may be utilized to expose the active regions 1A, 1B, 1C, and 1D of the first composite base die 104a. As can be seen from box 106, the reticle 108 is sized such that the reticle 108 can expose all active regions 1A, 1B, 1C, and 1D of a composite base die 104a simultaneously. The stepper apparatus 110 may then overstep or move the reticle 108 to the next active regions 1A, 1B, 1C, and 1D of the second base die 104b, thereby leaving a space between exposures.

An aligner apparatus 114 may then be utilized to expose (e.g., perform a lithographic operation on) the inactive regions 1E, 1F, 1G, and 1H of the composite base dies 104. For example, portions of the inactive regions 1E, 1F, 1G, and 1H that may be utilized for metal fill for the backend of line (BEOL) layers of the composite base dies 104 may be exposed by the aligner apparatus 114. Furthermore, TSVs in the inactive regions 1E, 1F, 1G, and 1H may be exposed utilizing the aligner apparatus 114. Furthermore, power distribution routing may be exposed in the inactive regions 1E, 1F, 1G, and 1H utilizing the aligner apparatus 114. Additionally, minimal signal or clock routing between composite base dies 104 outside the active regions 1A, 1B, 1C, and 1D may also be exposed utilizing the aligner apparatus 114. The exposure operations performed by the stepper apparatus 110 and the aligner apparatus 114 occur layer by layer until all layers of the wafer 102 have been processed.

In configurations, there likely may be only one exposure per layer of the wafer 102 utilizing the aligner apparatus 114. However, in configurations, there may be two exposures utilizing the aligner apparatus 114 where the aligner apparatus 114 exposes both the metal fills and TSVs in a layer. Likewise, there generally is only one exposure of active regions 1A, 1B, 1C, and 1D for each composite base die 104 per layer of the wafer 102 utilizing the stepper apparatus 110. However, as previously noted, the stepper apparatus 110 exposes the active regions 1A, 1B, 1C, and 1D of the composite base dies 104 for each composite base die 104 defined within the wafer 102 individually, e.g., the reticle 108 is overstepped from one composite base die 104 to the next composite base die 104.

In configurations, depending on the size of the reticle 108 and the layout of the composite base die 104, multiple active regions 1A, 1B, 1C, and 1D of a composite base die 104 may be exposed simultaneously as is the case with the example of FIG. 1. For example, referring to back FIG. 2A, as may be seen, the reticle size 208 is big enough to expose active regions 202a and 202b simultaneously.

Thus, in configurations, a limited region of each composite base die 104 may be exposed utilizing the stepper apparatus 110 while other regions within the backend of line (BEOL) and optionally the frontend of line (FEOL), e.g., implants, early metal layers, utilize the aligner apparatus 114 for exposure. In configurations, the implants and early metal layers, or the FEOL, may utilize the stepper apparatus 110 to achieve a fine pitch.

Figure 3:
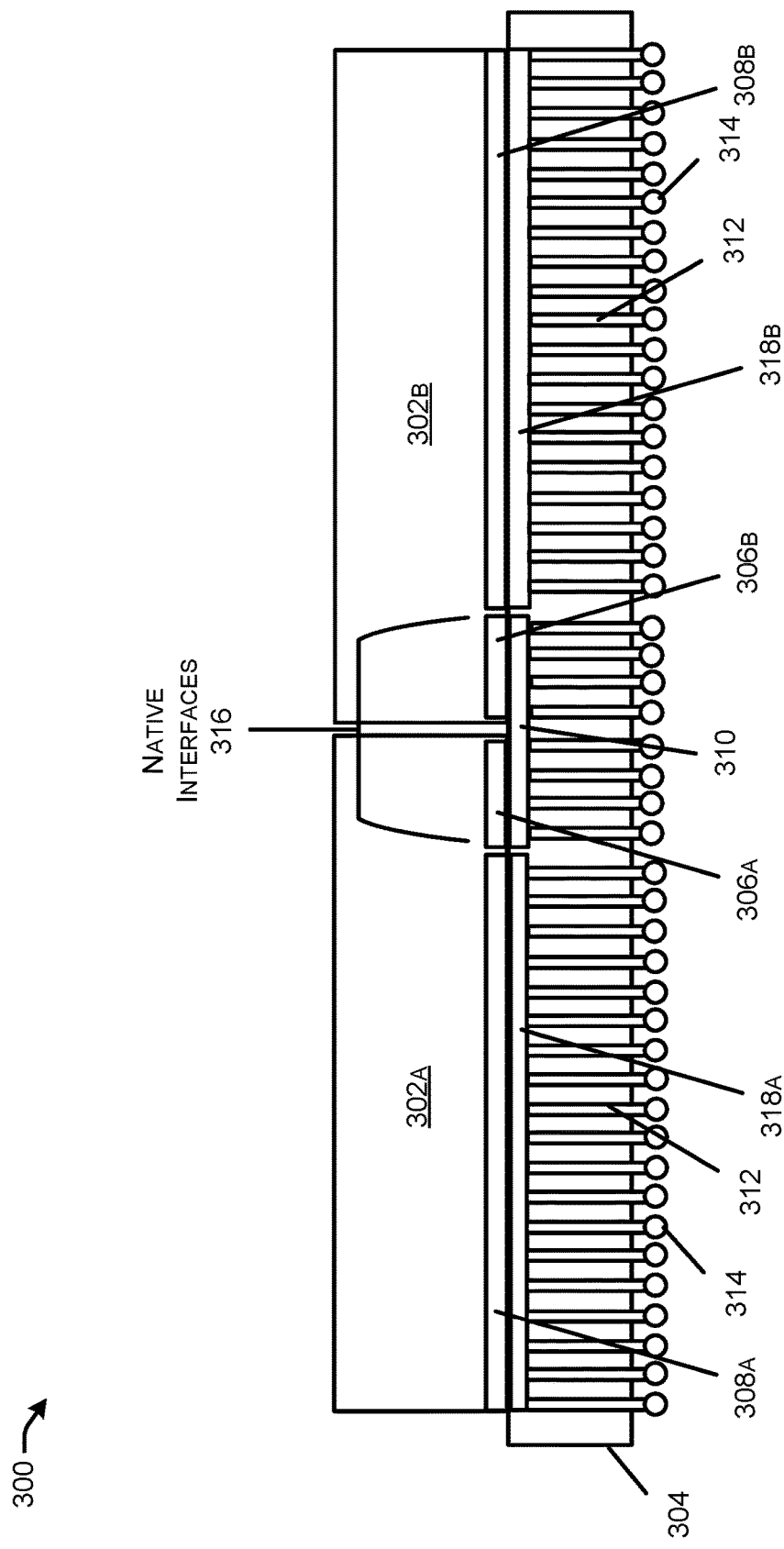
FIG. 3 schematically illustrates a cross-sectional view of an example of a microelectronic device that includes a composite base die.

FIG. 3 schematically illustrates a cross-sectional view of an example of a microelectronic device 300. The microelectronic device 300 includes active dies 302a, 302b located on a composite base die 304, e.g., an interposer corresponding to a composite base die 104 of FIG. 1. Regions 306a, 306b are active regions corresponding to active regions 1A, 1B, 1C, and 1D of FIG. 1. Regions 308a, 308b are inactive regions corresponding to inactive regions 1E, 1F, 1G, and 1H of FIG. 1. In configurations, a bridging area 310 may be provided in the composite base die 304 between the active regions 306a, 306b. The microelectronic device also includes TSVs 312 and bumps 314 to couple the microelectronic device 300 to, for example, a substrate, a circuit board, another microelectronic device, etc. (not illustrated).

As previously noted, the active regions 306a, 306b require a fine pitch to allow for native interfaces 316 between the active dies 302a, 302b and the composite base die 304. In configurations, other types of interfaces between the active dies 302a, 302b and the composite base die 304 at the active regions 306a, 306b may be utilized. Such other types of interfaces require a high density pitch however. The inactive regions 308a, 308b as previously noted, generally only require a conventional (coarse) pitch to interface with passive regions 318a, 318b of the composite base die 304. Such pitch is generally greater than 130 microns. In configurations, the pitch in the inactive regions 308a, 308b may be 100 microns to 130 microns. As previously noted, the fine pitch in the active regions 306a, 306b may be in a range of one micron to 10 microns. In some configurations, the fine pitch may be below one micron, while in other configurations, the fine pitch may be between 10 and 100 microns. Thus, interconnects in the active regions 306a, 306b on the composite base die 304 have a higher density, which is needed for native interfaces with the active dies 302a, 302b so that the composite base die 304 can handle driving the native interfaces. Thus, the stepper apparatus 110 is required to expose the various components in the layers of the active regions 306a, 306b, as previously discussed, since the stepper apparatus 110 can achieve the higher density while the aligner apparatus 114 generally cannot.

As previously noted, the inactive regions 308a, 308b, may have areas exposed in the various layers utilizing the aligner apparatus 114 (illustrated in FIG. 1). Examples of areas exposed in the various layers of the inactive regions 308a, 308b include, for example, pass throughs, metal fills (which may be utilized to balance the interposer), an optional power mesh to provide a robust power supply for the resulting microelectronic device 300, a minor routing to provide various signals, and "massive" passive components.

In configurations, the passive component comprises a capacitor. In other configurations, the passive component may comprise other devices, such as an inductor, a resistor, a voltage regulator, a filter, and/or a resonator. The passive component may be integrated into a layer of passive components (e.g., a massive number of passive devices) that is directly bonded to, for example, the actives dies 302a, 302b. In configurations, for example, the layer of passive components may be disposed in a layer of the composite base die 304 and may directly connect with the active dies 302a, 302b via the inactive regions 308a, 308b. The layer of passive components can thereby reduce the space occupied by passive components at the integrated device, at the package, and/or at the system board. Moreover, positioning the passive electronic component closer to active components of the active dies 302a, 302b may beneficially reduce overall inductance, which can improve the bandwidth and signal integrity of the semiconductor element, as compared with passive devices that are mounted to the package substrate or system board. In addition, the overall capacitance provided by the disclosed embodiments enables significantly higher capacitances (and reduced inductance) as compared with discrete passives mounted to a die. For example, the structures and techniques described in U.S. Patent Publication No. 2018/0190583A1, filed Feb. 7, 2017, entitled "Bonded Structures with Integrated Passive Component", which is incorporated by reference in its entirety, may be utilized according to some configurations.

Referring back to FIG. 1, in configurations, the aligner apparatus 114 may be utilized first to provide (pattern) for alignment features for the stepper apparatus 110. The stepper apparatus 110 may then be overstepped to expose only active regions 1A, 1B, 1C, and 1D or active circuitry as required. The stepper apparatus 110 is utilized layer by layer. The aligner apparatus 114 may be utilized for TSV locations in the active regions 1A, 1B, 1C, and 1D, e.g., "via in the middle." The stepper apparatus 110 may be utilized in configurations for the TSV locations, e.g., via in the middle, for only the active regions 1A, 1B, 1C, and 1D.

In configurations, the stepper apparatus 110 may be utilized for all active regions 1A, 1B, 1C, and 1D of a layer of the wafer 102 and then the aligner apparatus 114 may be utilized for the inactive regions 1E, 1F, 1G, and 1H at the layer of the wafer 102. In configurations, the process may be switched between the stepper apparatus 110 and the aligner apparatus 114 after several intermediate steps. For example, the stepper apparatus 110 may be utilized for exposure operations of active regions 1A, 1B, 1C, and 1D and then an etch operation may be performed by another component (not illustrated) on the exposed portions of the active regions 1A, 1B, 1C, and 1D. The aligner apparatus 114 may then be utilized for exposure operations of inactive regions 1E, 1F, 1G, and 1H and then an etch operation may be performed by another component (not illustrated) on the exposed portions of the inactive regions 1E, 1F, 1G, and 1H.

Thus, in some configurations, exposure steps may be performed and then another step may be performed or the steps may be alternated. For example, the stepper apparatus 110 may perform a lithography exposure operation on the active regions 1A, 1B, 1C, and 1D and then the aligner apparatus 114 may perform a lithography exposure operation on the inactive regions 1E, 1F, 1G, and 1H. An etch operation may be performed for all exposed areas in the active regions 1A, 1B, 1C, and 1D and the inactive regions 1E, 1F, 1G, and 1H. Alternatively, the stepper apparatus 110 may perform a lithography exposure operation on the active regions 1A, 1B, 1C, and 1D and then an etch operation may be performed on the exposed active regions 1A, 1B, 1C, and 1D. Then the aligner apparatus 114 may perform a lithography exposure operation on the inactive regions 1E, 1F, 1G, and 1H and then an etch operation may be performed on the exposed inactive regions 1E, 1F, 1G, and 1H.

Accordingly, as an example, the aligner apparatus 114 may be utilized first to pattern for alignment features for the stepper apparatus 110. Once the active regions and the inactive regions of the composite base dies 104 defined in the wafer 102 have been exposed and etched in a first layer, the process may be repeated for a second layer, a third layer, etc., of the wafer 102.

Generally, continuing with the example related to the first layer, other operations may be performed on the first layer in addition to the exposure and etching operations of the various layers of the wafer 102. For example, a resist may first be applied to the first layer of the wafer 102. In configurations, an antireflective coating may be applied to the entire wafer 102. The stepper apparatus 110 may then be utilized to expose the active circuitry within the composite base dies 104, as previously described. For example, the stepper apparatus 110 may expose active regions 1A, 1B, 1C, and 1D within the first layer of the first composite base die 104a and then the reticle 108 may be moved, e.g., overstepped, to active regions 1A, 1B, 1C, and 1D of the second composite base die 104b defined within the wafer 102. The stepper apparatus 110 may then perform an exposure operation for the active regions 1A, 1B, 1C, and 1D of the second composite base die 104b. This may be repeated for the active regions 1A, 1B, 1C, and 1D of the composite base dies 104c-104h.

The wafer 102 may then be processed using the aligner apparatus 114, e.g., the aligner apparatus 114 may perform an exposure operation for the composite base dies 104a-104h defined in the wafer 102 for the inactive regions 1E, 1F, 1G, and 1H, e.g., for the various features in the inactive regions 1E, 1F, 1G, and 1H including through silicon vias (TSVs). In configurations, TSVs in the active regions 1A, 1B, 1C, and 1D (via in the middle) may be exposed by the aligner apparatus 114. In some configurations, TSVs in the active regions 1A, 1B, 1C, and 1D (via in the middle) by the stepper apparatus 110 in later exposure operations by the stepper apparatus 110. In configurations, the TSVs may be continuous (one or more holes per net at a later step going through multiple dielectrics). In configurations, the TSVs may be disjointed with many offset vias at different diameters depending upon the layer of the wafer 102. Any given layer of the composite base die 102 may include many TSVs. Jumpers between sections of the active regions 1A, 1B, 1C, and 1D that connect active dies 302a, 302b of FIG. 3 of the microelectronic device 300 may be exposed by either the stepper apparatus 110 or the aligner apparatus 114 depending upon factors such as, for example, capability, cost, etc.

After the aligner apparatus 114 is used for exposure operations in the first layer, an etch/pattern operation may be performed by an appropriate apparatus. A cleaning operation may also be performed. In configurations, the first layer may be an implant layer and thus, implant operations may then be performed, e.g., a n-doping or a p-doping implantation operation may be performed. Masks may then be stripped and a further cleaning operation may then be performed. The entire process may then be repeated for a second layer, third layer, etc., depending on the number of implant layers. Once the implant layers are completed, then subsequent layers, e.g., metal layers, may be processed in a similar manner. In configurations, there may be additional operations performed not discussed herein. The operations discussed herein are merely examples and are not meant to be limiting.

Additionally, the order of the steps may be varied. For example, there could be negative or positive resists applied. Also, the stepper apparatus 110 may expose active regions of a first layer and then the etching process may be performed for the exposed active regions in the first layer. The aligner apparatus 114 may then expose inactive regions in the first layer and then the etching process may be performed before additional operations are performed.

In configurations, materials for the processes described herein may be dictated by the most demanding process, e.g., the stepper apparatus is the most likely apparatus to dictate the needed materials. For example, the stepper apparatus 110 may dictate the materials used in the other lithographic processes performed by the aligner apparatus 114. Additionally, the light source of the stepper apparatus 110 needs to be compatible with the mask materials in all lithographic steps. Thus, in configurations, an antireflective coating may be placed on the wafer 102. Generally, the antireflective coating is placed over the entire top surface of the wafer 102. In configurations, in addition to or instead of the aligner apparatus 114, a direct imaging apparatus may be utilized for features in the inactive regions.

FIG. 4 illustrates a flow diagram of an example method 400 for performing exposure operations on a wafer utilizing both a stepper apparatus and an aligner apparatus. The exposure operations are performed with respect to large composite base dies or interposers, e.g., composite base dies 104, defined within the wafer, e.g., wafer 102, where the interposers will become a part of microelectronic devices, e.g., microelectronic device 300, by coupling with active dies or microchips, e.g., active dies 302a, 302b. In configurations, the composite base dies may be coupled to the active dies via "native interconnects" utilizing direct bonding techniques. In the flow diagram, the operations of method 400 are shown as individual blocks.

At block 402, a stepper apparatus may perform a first exposure operation on a first layer of the wafer with respect to a first active region of a first base die defined in the wafer. For example, the stepper apparatus 110 may perform a first exposure operation on a first layer of the wafer 102 with respect to the first active region, e.g., the active regions 1A, 1B, 1C, and 1D, of the first base die 104a defined in the wafer 102.

At block 404, a reticle of the stepper apparatus may be moved over a second active region of a second base die defined in the wafer. For example, the reticle 108 of the stepper apparatus 110 may be moved over the second active region, e.g., the active regions 1A, 1B, 1C, and 1D, of the second base die 104b defined in the wafer 102.

At block 406, the stepper apparatus may perform the first exposure operation on the first layer of the wafer with respect to the second active region of the second base die defined in the wafer. For example, the stepper apparatus 110 may perform the first exposure operation on the first layer of the wafer 102 with respect to the second active region, e.g., the active regions 1A, 1B, 1C, and 1D, of the second base die 104b defined in the wafer 102.

At block 408, an aligner apparatus may perform a second exposure operation on the first layer of the wafer with respect to a first inactive region of the first base die defined in the wafer and a second inactive region of the second base die defined in the wafer. For example, the aligner apparatus 114 may perform a second exposure operation on the first layer of the wafer 102 with respect to a first inactive region, e.g., the inactive regions 1E, 1F, 1G, and 1H, of the first base die 104a defined in the wafer 102 and a second inactive region, e.g., the inactive regions 1E, 1F, 1G, and 1H, of the second base die 104b defined in the wafer 102.

While the invention is described with respect to the specific examples and configurations, it is to be understood that the scope of the invention is not limited to these specific examples and configurations. Since other modifications and changes varied to fit particular operating requirements and environments will be apparent to those skilled in the art, the invention is not considered limited to the examples and configurations chosen for purposes of disclosure and covers all changes and modifications which do not constitute departures from the true spirit and scope of this invention.

Although the application describes configurations having specific structural features and/or methodological acts, it is to be understood that the claims are not necessarily limited to the specific features or acts described. Rather, the specific features and acts are merely illustrative of some embodiments that fall within the scope of the claims of the application.

What is claimed is:

1. A method of manufacturing two or more base dies on a single wafer comprising:
   exposing a first region of a first base die using a first photolithographic-exposure apparatus;
   subsequent to exposing the first region of the first base die, exposing a first region of a second base die using the first photolithographic-exposure apparatus;
   exposing a second region of the first base die using a second photolithographic-exposure apparatus; and
   exposing a second region of the second base die using the second photolithographic-exposure apparatus,
   wherein the first photolithographic-exposure apparatus is configured to resolve smaller features with respect to features resolved by the second photolithographic-exposure apparatus.

2. The method of claim 1, wherein:
   a size of the first region of the first base die is substantially equal to a size of the first region of the second base die; and
   the size of the first region of the first base die and the size of the first region of the second base die are both smaller than a size of the first base die and a size of the second base die.

3. The method of claim 1, wherein the first region of the first base die and the first region of the second base die are non-contiguous.

4. The method of claim 1, wherein an area of the first base die consists only of (i) the first region of the first base die and (ii) the second region of the first base die.

5. The method of claim 1, wherein the first region of the first base die is disposed substantially at a center of the first base die.

6. The method of claim 1, wherein (i) exposing the first region of the first base die and (ii) exposing the first region of the second base die are performed using a same photoresist layer.

7. The method of claim 1, wherein (i) exposing the first region of the first base die and (ii) exposing the first region of the second base die are performed using different photoresist layers.

8. The method of claim 1, further comprising:
   etching the single wafer between use of the first photolithographic-exposure apparatus and use of the second photolithographic-exposure apparatus.

9. The method of claim 1, further comprising:
   bonding a first integrated circuit to a first portion of the first region of the first base die; and
   bonding a second integrated circuit to a second portion of the first region of the first base die.

10. The method of claim 9, wherein:
    bonding the first integrated circuit to the first portion of the first region of the first base die comprises hybrid bonding; and bonding the second integrated circuit to the second portion of the first region of the first base die comprises hybrid bonding.

11. The method of claim 10, wherein;
a pitch of native interconnects in (i) the first region of the first base die and (ii) the first region of the second base die is in a range of one to 10 microns; and
a pitch of native interconnects in (i) the second region of the first base die and (ii) the second region of the second base die is 100 microns or more.

12. The method of claim 1, wherein:
(i) exposing the second region of the first base die and (ii) exposing the second region of the second base die exposes metal fill for backend of line (BEOL) layers of the first base die and the second base die; and
the method further comprises:
exposing the second region of the first base die using the second photolithographic-exposure apparatus a second time to expose through silicon vias (TSVs) in the second region of the first base die; and
exposing the second region of the second base die using the second photolithographic-exposure apparatus a second time to expose through TSVs in the second region of the second base die.

13. The method of claim 1, wherein the first photolithographic-exposure apparatus is a stepper apparatus.

14. The method of claim 1, wherein the second photolithographic-exposure apparatus is an aligner apparatus.

15. The method of claim 1, wherein the first region of the first base die comprises an active region.

16. The method of claim 1, wherein the second region of the first base die comprises an inactive region.

17. The method of claim 1, wherein:
the first photolithographic-exposure apparatus performs exposing the first region of the first base die;
then the second photolithographic-exposure apparatus performs exposing the second region of the first base die;
then the first photolithographic-exposure apparatus performs exposing the first region of the second base die using the first photolithographic-exposure apparatus; and
then the second photolithographic-exposure apparatus performs exposing the second region of the second base die.

18. The method of claim 1, wherein:
the first photolithographic-exposure apparatus performs exposing the first region of the first base die;
then the first photolithographic-exposure apparatus performs exposing the first region of the second base die using the first photolithographic-exposure apparatus;
then the second photolithographic-exposure apparatus performs exposing the second region of the first base die; and
then the second photolithographic-exposure apparatus performs exposing the second region of the second base die.

19. An arrangement comprising:
a first photolithographic-exposure apparatus; and
a second photolithographic-exposure apparatus,
wherein the arrangement is configured to perform actions comprising:
exposing a first region of a first base die using the first photolithographic-exposure apparatus;
subsequent to exposing the first region of the first base die, exposing a first region of a second base die using the first photolithographic-exposure apparatus;
exposing a second region of the first base die using the second photolithographic-exposure apparatus; and
exposing a second region of the second base die using the second photolithographic-exposure apparatus,
wherein the first photolithographic-exposure apparatus is configured to resolve smaller features with respect to features resolved by the second photolithographic-exposure apparatus.

20. The arrangement of claim 19, wherein (i) exposing the first region of the first base die and (ii) exposing the first region of the second base die are performed using a same photoresist layer.

21. The arrangement of claim 19, wherein (i) exposing the first region of the first base die and (ii) exposing the first region of the second base die are performed using different photoresist layers.

22. The arrangement of claim 19, wherein:
(i) exposing the second region of the first base die and (ii) exposing the second region of the second base die exposes metal fill for backend of line (BEOL) layers of the first base die and the second base die; and
the actions further comprise:
exposing the second region of the first base die using the second photolithographic-exposure apparatus a second time to expose through silicon vias (TSVs) in the second region of the first base die; and
exposing the second region of the second base die using the second photolithographic-exposure apparatus a second time to expose through TSVs in the second region of the second base die.

23. The arrangement of claim 19, wherein the first photolithographic-exposure apparatus is a stepper apparatus.

24. The arrangement of claim 19, wherein the second photolithographic-exposure apparatus is an aligner apparatus.

25. The arrangement of claim 19, wherein the first region of the first base die comprises an active region.

26. The arrangement of claim 19, wherein the second region of the first base die comprises an inactive region.

27. The arrangement of claim 19, wherein:
the first photolithographic-exposure apparatus performs exposing the first region of the first base die;
then the second photolithographic-exposure apparatus performs exposing the second region of the first base die;
then the first photolithographic-exposure apparatus performs exposing the first region of the second base die using the first photolithographic-exposure apparatus; and
then the second photolithographic-exposure apparatus performs exposing the second region of the second base die.

28. The arrangement of claim 19, wherein:
the first photolithographic-exposure apparatus performs exposing the first region of the first base die;
then the first photolithographic-exposure apparatus performs exposing the first region of the second base die using the first photolithographic-exposure apparatus;
then the second photolithographic-exposure apparatus performs exposing the second region of the first base die; and
then the second photolithographic-exposure apparatus performs exposing the second region of the second base die.

* * * * *